(12) United States Patent
Kim et al.

(10) Patent No.: US 12,469,828 B2
(45) Date of Patent: Nov. 11, 2025

(54) DISPLAY DEVICE USING SEMICONDUCTOR LIGHT-EMITTING DEVICES HAVING A PASSIVATION LAYER

(71) Applicant: LG ELECTRONICS INC., Seoul (KR)

(72) Inventors: Soohyun Kim, Seoul (KR); Kiseong Jeon, Seoul (KR); Jaewon Chang, Seoul (KR); Hyunho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 529 days.

(21) Appl. No.: 17/798,211

(22) PCT Filed: Feb. 17, 2020

(86) PCT No.: PCT/KR2020/002204
§ 371 (c)(1),
(2) Date: Aug. 8, 2022

(87) PCT Pub. No.: WO2021/162155
PCT Pub. Date: Aug. 19, 2021

(65) Prior Publication Data
US 2023/0084381 A1 Mar. 16, 2023

(30) Foreign Application Priority Data
Feb. 11, 2020 (KR) .................. 10-2020-0016564

(51) Int. Cl.
*H01L 25/075* (2006.01)
*H10H 20/01* (2025.01)
*H10H 20/857* (2025.01)

(52) U.S. Cl.
CPC ....... *H01L 25/0753* (2013.01); *H10H 20/857* (2025.01); *H10H 20/0364* (2025.01)

(58) Field of Classification Search
CPC .............. H01L 25/0753; H01L 25/167; H01L 2224/95101; H10H 20/857;
(Continued)

(56) References Cited

U.S. PATENT DOCUMENTS

2013/0168708 A1* 7/2013 Shibata .................. H01L 24/95
257/88
2014/0042479 A1* 2/2014 Margalit .............. H10H 20/814
438/26

(Continued)

FOREIGN PATENT DOCUMENTS

KR 10-2010-0115354 10/2010
KR 102167942 B1 * 7/2015 ............... F21K 9/00
(Continued)

OTHER PUBLICATIONS

European Patent Office Application Serial No. 20918921.6, Search Report dated Mar. 15, 2024, 7 pages.
(Continued)

*Primary Examiner* — Eva Y Montalvo
*Assistant Examiner* — Jiyoung Oh
(74) *Attorney, Agent, or Firm* — LEE, HONG, DEGERMAN, KANG & WAIMEY

(57) ABSTRACT

The present invention relates to a display device, and more particularly, to a display device using semiconductor light-emitting devices of several micrometers to tens of micrometers in size. The present invention provides a display device comprising: a base part; a plurality of assembly electrodes which is arranged on the base part and which generates an electric field when power is applied thereto; a dielectric layer formed to cover the assembly electrodes; and a plurality of semiconductor light-emitting devices arranged on the dielectric layer; wherein each of the semiconductor light-emitting devices comprises: a first assembly control
(Continued)

layer formed at a portion of the whole area of one surface facing the dielectric layer; and a second assembly control layer formed at the other portion of the whole area of the one surface facing the dielectric layer, and made of a material different from that of the first assembly control layer.

10 Claims, 16 Drawing Sheets

(58) Field of Classification Search
CPC .... H10H 20/0364; H10H 20/01; H10H 20/84; H10H 20/816; H10H 20/833; H10H 29/142; H10D 62/056; H10D 84/858; H10D 84/8316; H10F 30/24; A01N 1/146
USPC .......................................................... 257/89
See application file for complete search history.

(56) References Cited

U.S. PATENT DOCUMENTS

| 2014/0261613 | A1  |   | 9/2014  | Nielson et al. |               |
|--------------|-----|---|---------|----------------|---------------|
| 2018/0240937 | A1  | * | 8/2018  | Park           | H01L 25/0753  |
| 2019/0326477 | A1  | * | 10/2019 | Kim            | H01L 25/0753  |
| 2022/0320371 | A1  |   | 10/2022 | Park et al.    |               |
| 2022/0352446 | A1  | * | 11/2022 | Chung          | H10H 20/8312  |

FOREIGN PATENT DOCUMENTS

| KR | 10-2018-0007376 | 1/2018  |
| KR | 1020180030455   | 3/2018  |
| KR | 10-2018-0082003 | 7/2018  |
| KR | 10-2019-0029343 | 3/2019  |
| KR | 10-2019-0097946 | 8/2019  |
| KR | 20190117413     | 10/2019 |
| KR | 1020190122118   | 10/2019 |

OTHER PUBLICATIONS

Korean Intellectual Property Office Application No. 10-2020-0016564, Notice of Allowance dated Sep. 19, 2024, 8 pages.
PCT International Application No. PCT/KR2020/002204, International Search Report dated Nov. 5, 2020, 6 pages.

* cited by examiner

DISPLAY DEVICE USING SEMICONDUCTOR LIGHT-EMITTING DEVICES HAVING A PASSIVATION LAYER

CROSS-REFERENCE TO RELATED APPLICATIONS

This application is the National Stage filing under 35 U.S.C. 371 of International Application No. PCT/KR2020/002204, filed on Feb. 17, 2020, which claims the benefit of earlier filing date and right of priority to Korean Application No. 10-2020-0016564, filed on Feb. 11, 2020, the contents of which are all hereby incorporated by reference herein their entirety.

TECHNICAL FIELD

The present disclosure relates to a display device, and in particular, to a display device using a semiconductor light emitting diode having a size of several to several tens of μm.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED) having a cross-sectional area or diameter of 100 μm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of the micro LED is still insufficient. Accordingly, the present disclosure proposes a new type of manufacturing method in which the micro LED can be self-assembled.

DISCLOSURE

Technical Problem

One object of the present disclosure is to provide a new manufacturing process having high reliability in a large-screen display using a micro-sized semiconductor light emitting diode.

Another object of the present disclosure is to provide a manufacturing process capable of improving transfer precision when self-assembling a semiconductor light emitting diode as an assembly board.

Another object of the present disclosure is to enable self-assembly of a semiconductor light emitting diode having an asymmetric shape. Specifically, an object of the present disclosure is to provide a structure and a method for aligning asymmetric semiconductor light emitting diodes in one direction through self-assembly.

Technical Solution

In order to achieve the above object, the present disclosure provides a display device which includes a base portion; a plurality of assembled electrodes disposed on the base portion and configured to generate an electric field when power is applied; a dielectric layer formed to cover the assembled electrodes; and a plurality of semiconductor light emitting diodes disposed on the dielectric layer; in which each of the semiconductor light emitting diodes includes a first assembly control layer formed in a portion of an entire area of one surface facing the dielectric layer; and a second assembly control layer formed in another portion of the entire area of one surface facing the dielectric layer and made of a material different from that of the first assembly control layer.

In an embodiment, a conductivity of a material constituting the first assembly control layer may be greater than a conductivity of a material constituting the second assembly control layer.

In an embodiment, the first assembly control layer may be formed on one side of the semiconductor light emitting diode, and the second assembly control layer may be formed on another side of the semiconductor light emitting diode.

In an embodiment, each of the assembled electrodes may include a protrusion protruding in a direction intersecting a direction in which the assembled electrodes extend.

In an embodiment, each of the assembled electrodes may include a first electrode and a second electrode disposed with the semiconductor light emitting diode therebetween.

In an embodiment, a protrusion formed on the first electrode and a protrusion provided on the second electrode may be formed to face each other.

In an embodiment, the first assembly control layer may be disposed to overlap the protrusions provided on each of the first and second electrodes.

In an embodiment, the second assembly control layer may be disposed to overlap a portion of the base portion in which the protrusions provided on each of the first and second electrodes are not formed.

In an embodiment, an area of the first assembly control layer may be 0.5 to 5.0 times an area of the second assembly control layer.

In an embodiment, the conductivity of the material constituting the first assembly control layer may be $1 \times 10^{+6}$ S·m$^{-1}$ (Siemens per meter) or more, and wherein the conductivity of the material constituting the second assembly control layer may be $1 \times 10^{-1}$ S·m$^{-1}$ or less.

Advantageous Effect

According to the present disclosure having the above configuration, in a display device in which individual pixels are formed of micro light emitting diodes, a large number of semiconductor light emitting diodes can be assembled at once.

As described above, according to the present disclosure, it is possible to pixelate a semiconductor light emitting diode in a large amount on a small-sized wafer and then transfer it to a large-area board. Through this, it is possible to manufacture a large-area display device at a low cost.

In addition, according to the manufacturing method of the present disclosure, a semiconductor light emitting diode is transferred simultaneously and multiple times in place using a magnetic field and an electric field in a solution, thereby being capable of realizing low-cost, high-efficiency, and high-speed transfer regardless of the size, number, or transfer area of parts.

Furthermore, since it is assembled by an electric field, selective assembly is possible through selective electrical application without a separate additional device or process. In addition, by disposing the assembly board on the upper side of the chamber, loading and unloading of the board can be facilitated, and non-specific binding of the semiconductor light emitting diode can be prevented.

According to the present disclosure, even if the semiconductor light emitting diode is formed asymmetrically, it is possible to align the semiconductor light emitting diode in a predetermined direction during self-assembly. Through this, the present disclosure makes it possible to utilize a semiconductor light emitting diode having a structure capable of maximizing light efficiency for self-assembly.

BEST MODE

Figure 1:
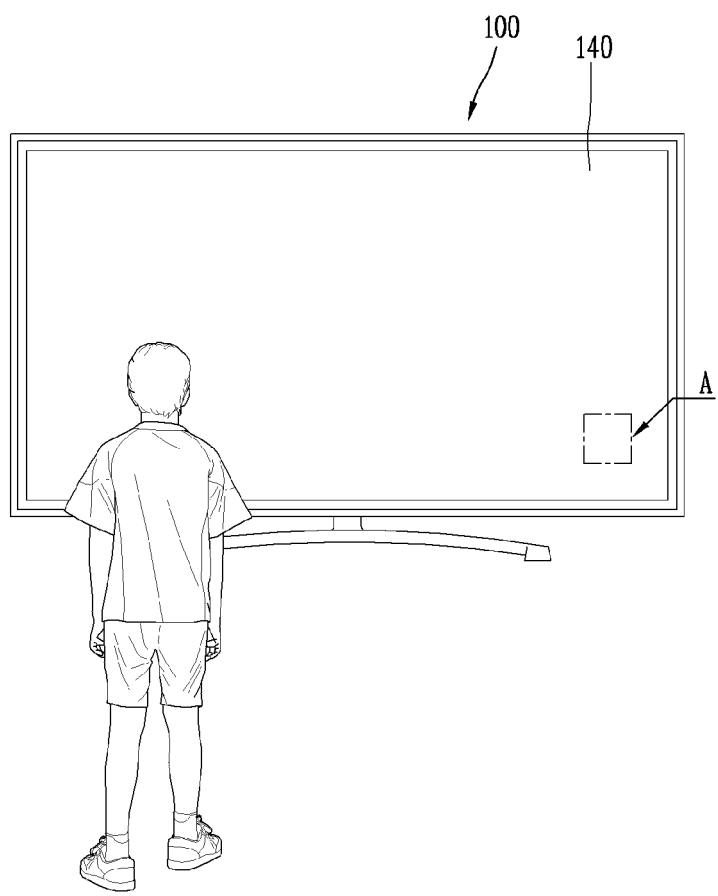
FIG. 1 is a conceptual diagram illustrating an embodiment of a display device using a semiconductor light emitting diode of the present disclosure.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 2:
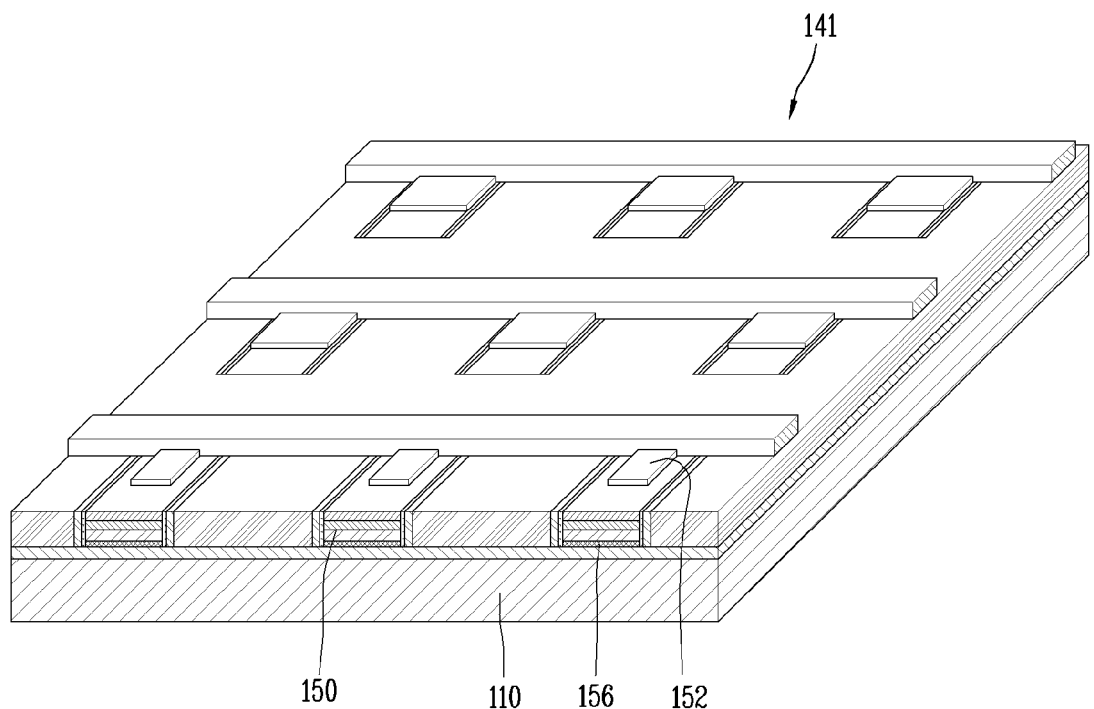
FIG. 2 is a partially enlarged view of portion A of the display device of FIG. 1.
Figure 3:
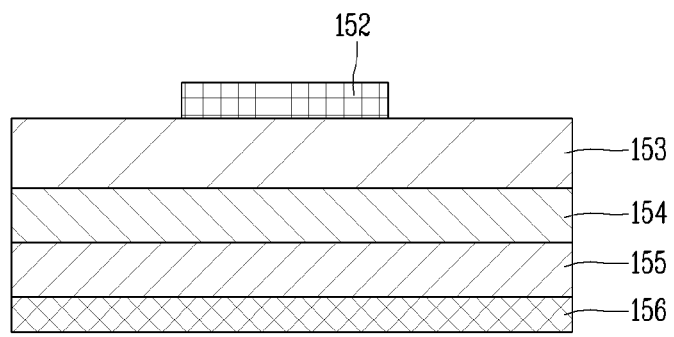
FIG. 3 is an enlarged view of the semiconductor light emitting diode of FIG. 2.
Figure 4:
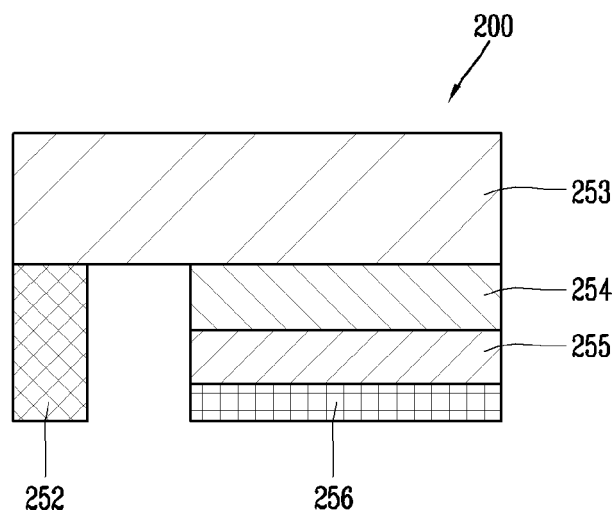
FIG. 4 is an enlarged view illustrating another embodiment of the semiconductor light emitting diode of FIG. 2.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 200 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
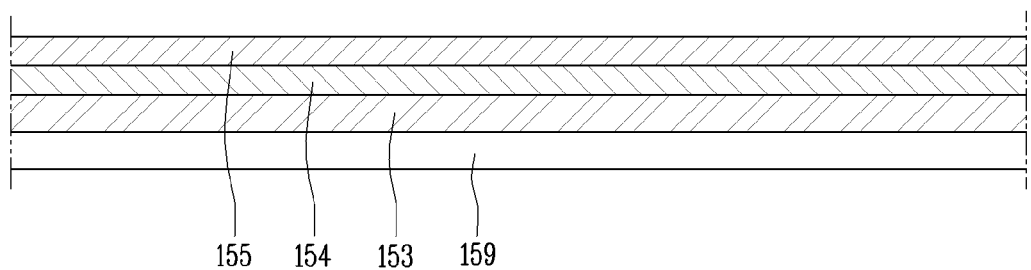
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Figure 5B:
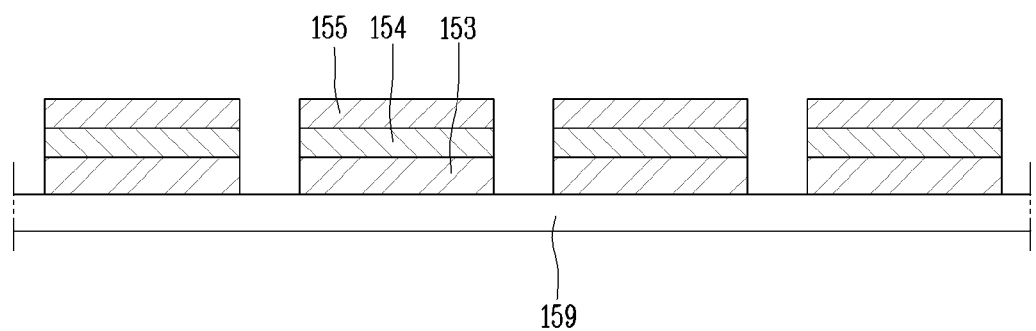

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
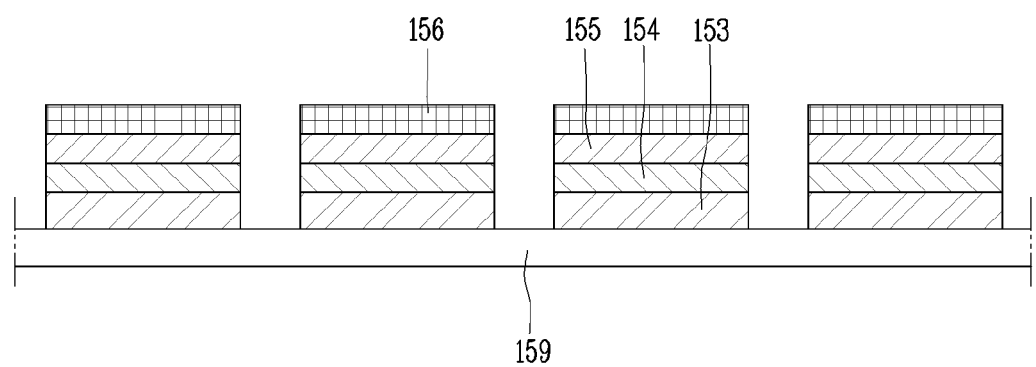

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Figure 5D:
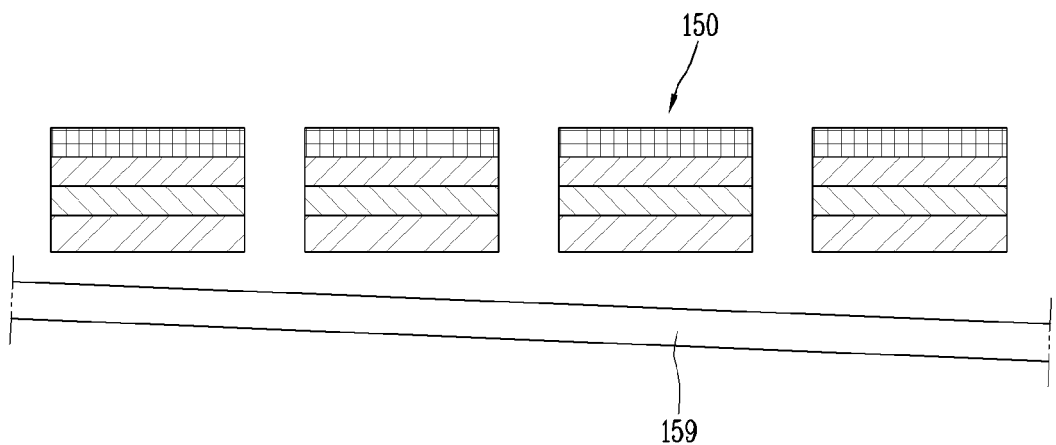

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
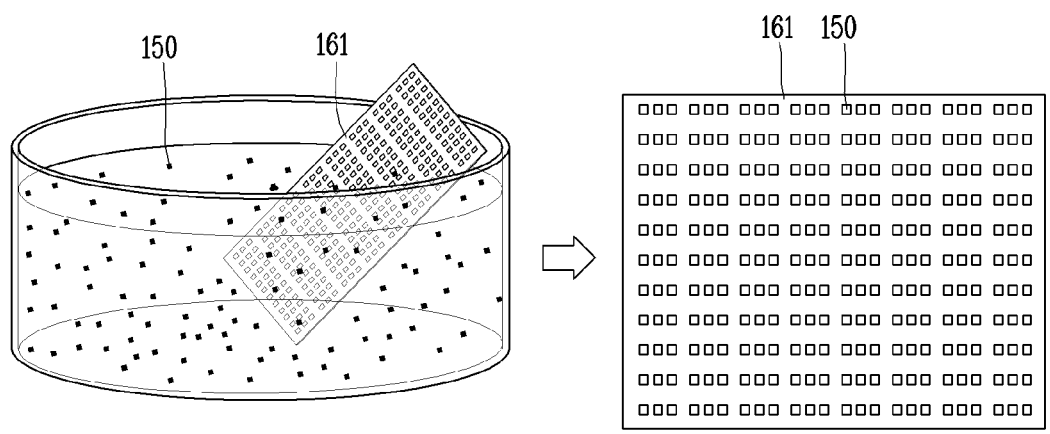

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
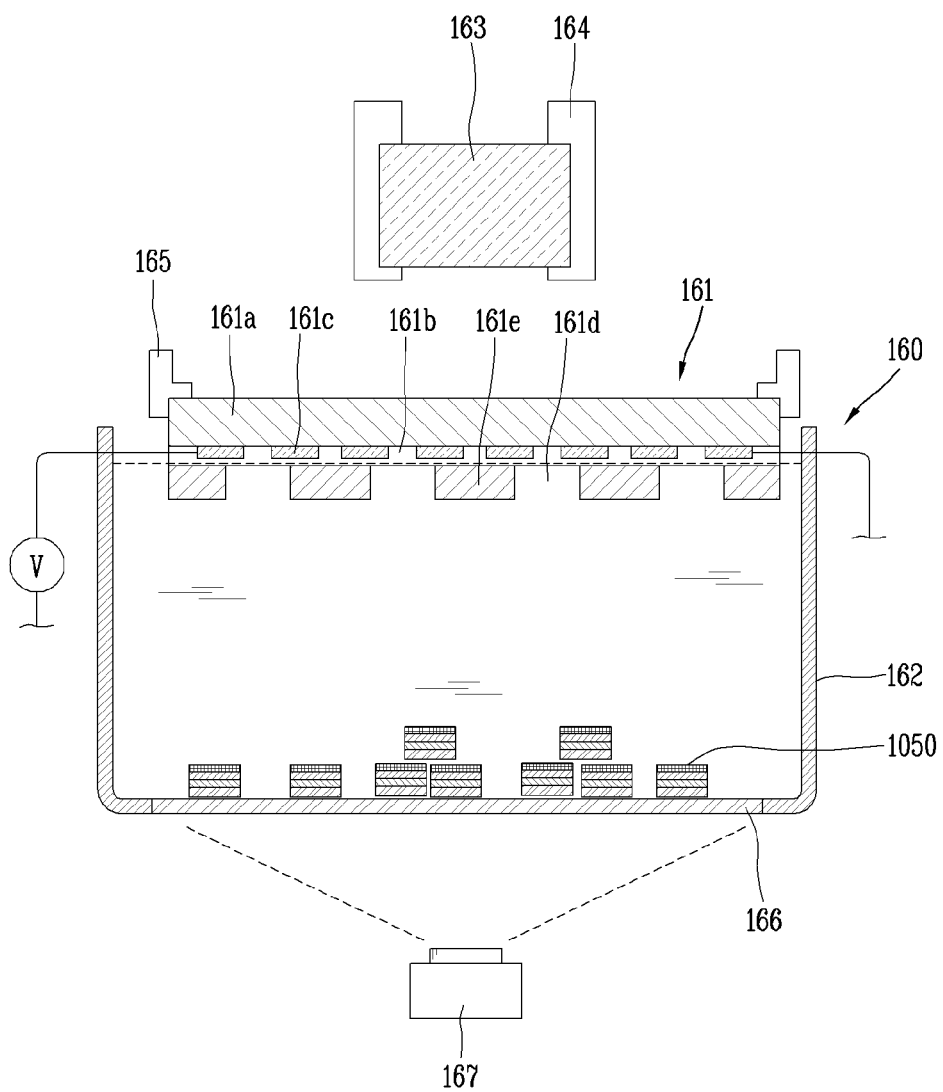
FIG. 6 is a conceptual diagram illustrating an example of a self-assembly apparatus of a semiconductor light emitting diode according to the present disclosure.
Figure 7:
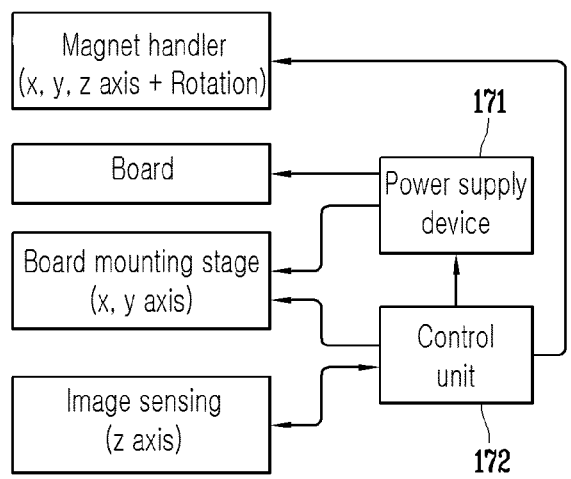
FIG. 7 is a block diagram of the self-assembly apparatus of FIG. 6.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several µm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
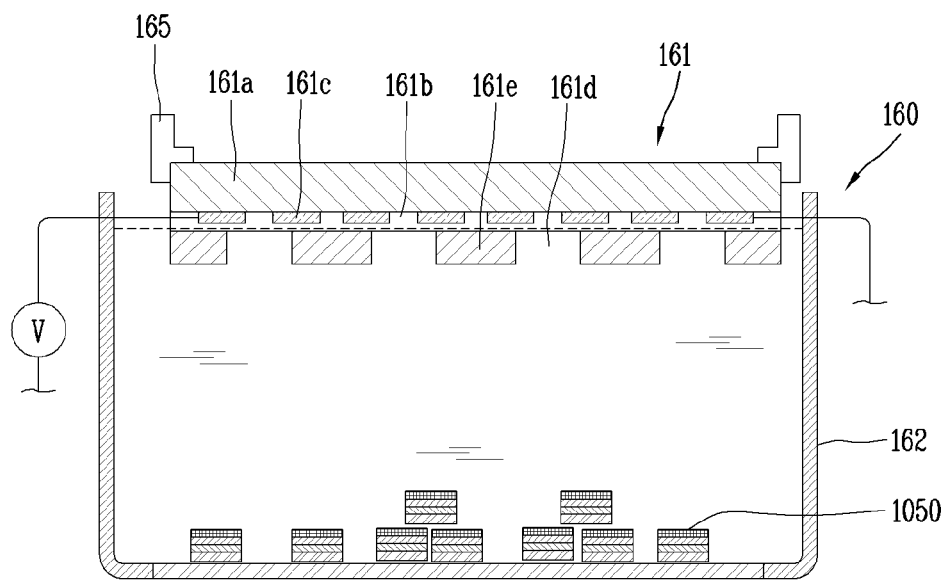
FIGS. 8A to 8E are conceptual views illustrating a process of self-assembling a semiconductor light emitting diode using the self-assembly apparatus of FIG. 6.
Figure 9:
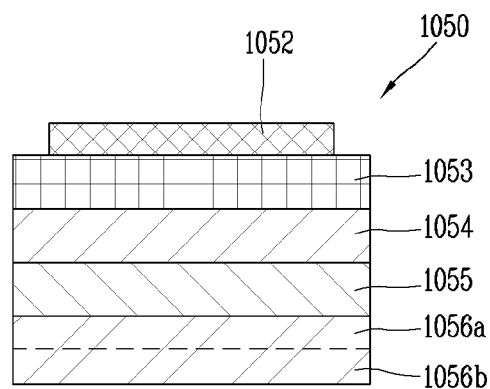
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
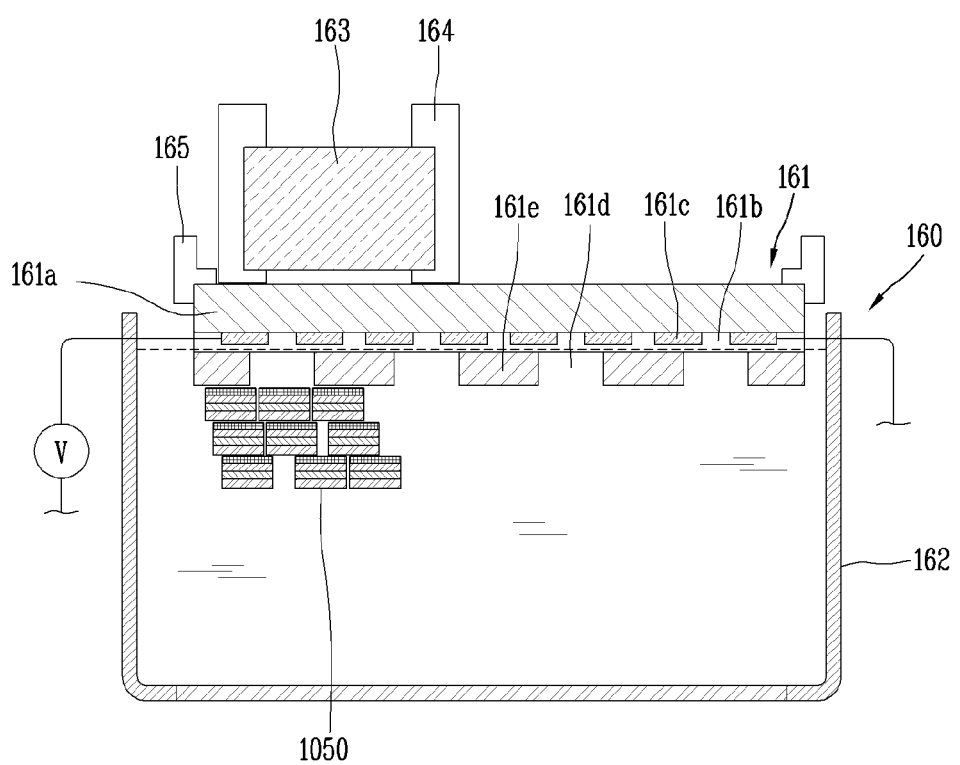

Next, a magnetic force is applied to the semiconductor light emitting diodes 1050 such that the semiconductor light emitting diodes 1050 vertically float in the fluid chamber 162 (FIG. 8B).

When the magnet 163 of the self-assembly apparatus moves from its original position to the opposite surface of the assembly surface of the board 161, the semiconductor light emitting diode 1050 may float toward the board 161 in the fluid. The original position may be a position deviated from the fluid chamber 162. As another example, the magnet 163 may be an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
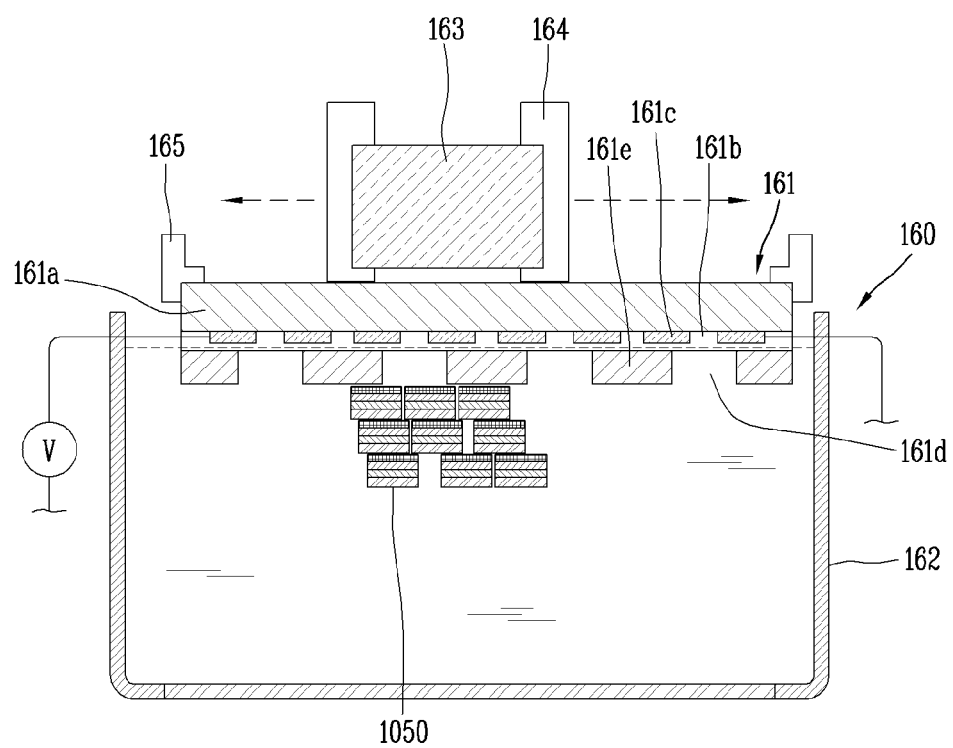

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Figure 8D:
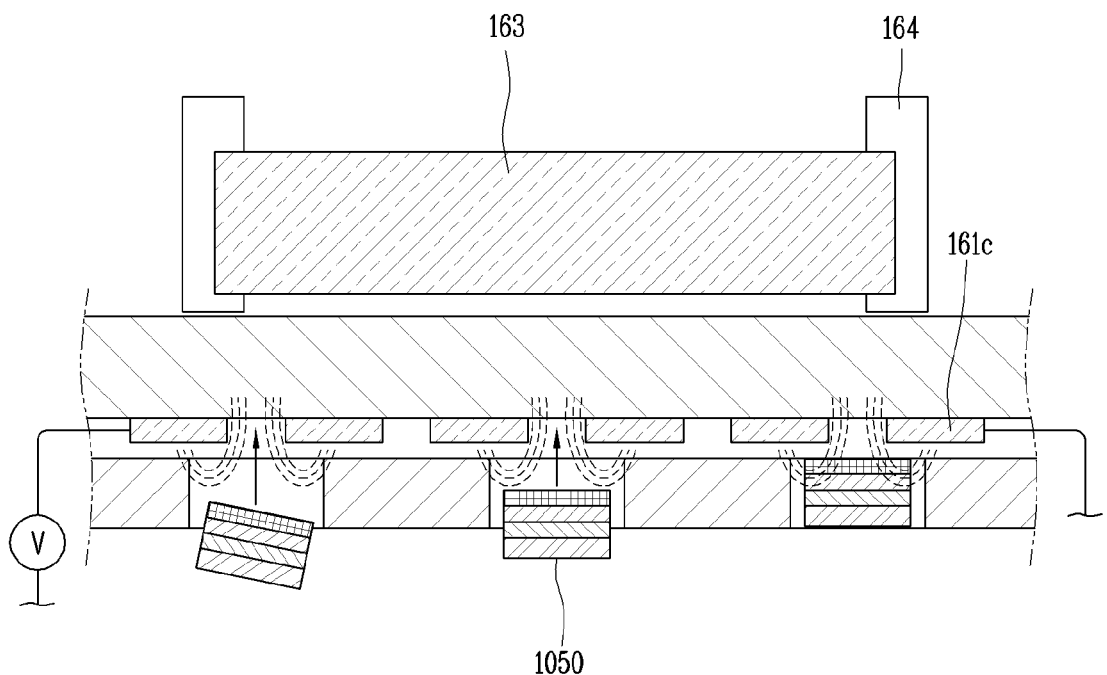
Figure 8E:
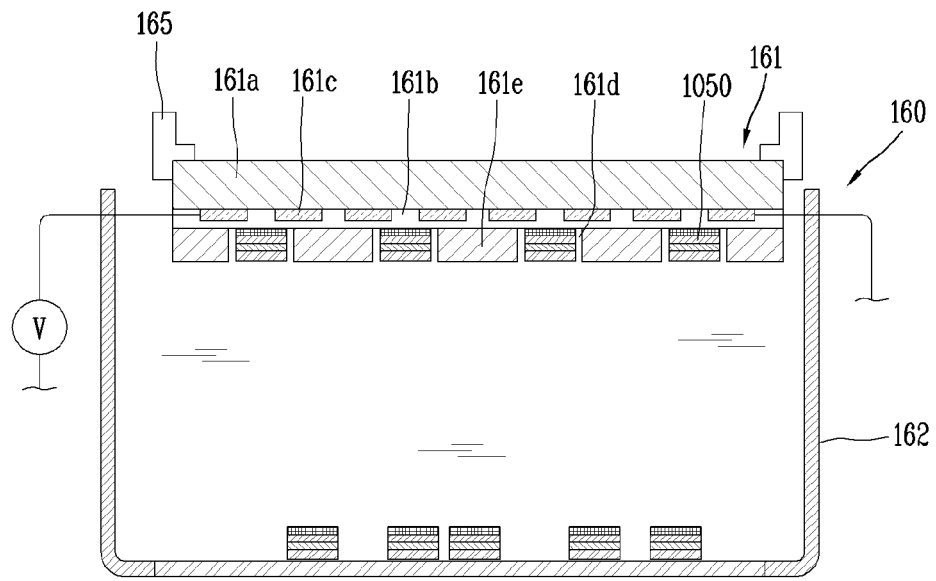

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Meanwhile, the self-assembly method described above can be applied only to the semiconductor light emitting diode in which even the conductive electrode provided in the semiconductor light emitting diode is symmetrically formed. For example, the self-assembly method described above may be applied only when the shape of the semiconductor light emitting diode is not only a cylindrical shape, but also when the first and second conductive electrodes formed on the semiconductor light emitting diode have a circular or annular shape.

Meanwhile, it is difficult to apply the self-assembly method described above to the semiconductor light emitting diode of the rectangular shape described in FIG. 4. Although it is possible to seat a rectangular semiconductor light emitting diode in the groove by self-assembly after forming a rectangular groove in the board, the direction in which the conductive electrode provided in the semiconductor light emitting diode is disposed is random. Specifically, when a rectangular semiconductor light emitting diode is being self-assembled, the first conductive electrode provided in some semiconductor light emitting diodes is disposed to face the first direction, and the first conductive electrode provided in the remaining semiconductor light emitting diodes is disposed to face a second direction opposite to the first direction. For this reason, it becomes difficult to connect the wiring electrode to the self-assembled semiconductor light emitting diode.

Meanwhile, it is more advantageous in terms of light efficiency to form the conductive electrode formed in the semiconductor light emitting diode asymmetrically. The present disclosure provides a structure and method enabling the self-assembly method to be also applied to a semiconductor light emitting diode in which a conductive electrode is asymmetrically formed.

Figure 10:
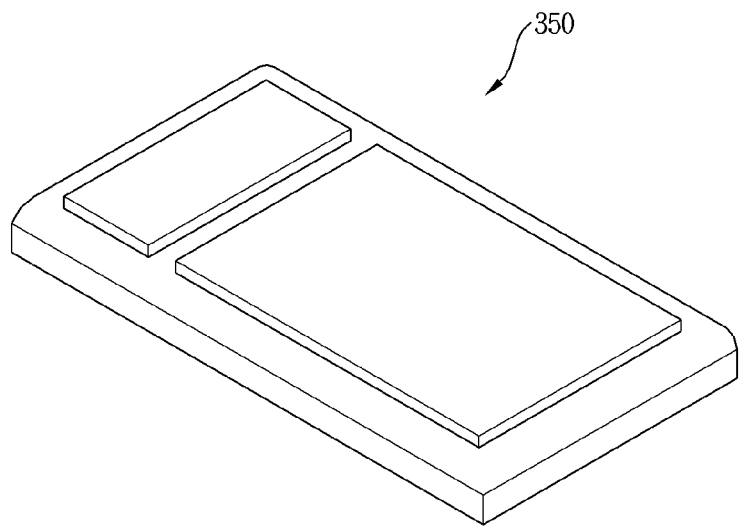
FIG. 10 is a perspective view of a semiconductor light emitting diode according to the present disclosure.
Figure 11:
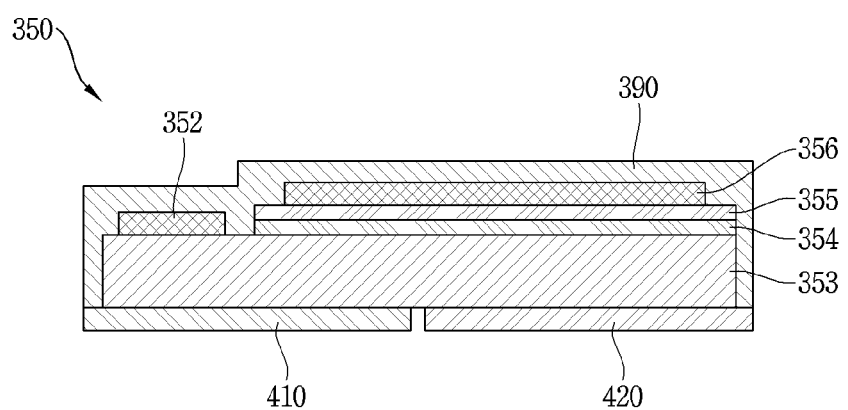
FIG. 11 is a cross-sectional view of a semiconductor light emitting diode according to the present disclosure.

FIG. 10 is a perspective view of a semiconductor light emitting diode according to the present disclosure, and FIG. 11 is a cross-sectional view of a semiconductor light emitting diode according to the present disclosure.

The present disclosure includes the above-described base portion 161a, a plurality of electrodes 161c (hereinafter referred to as assembled electrodes), a dielectric layer 161b, and a barrier rib 161e. A description thereof is replaced with the description of FIGS. 8A to 8E.

Meanwhile, referring to FIGS. 10 and 11, the semiconductor light emitting diode according to the present disclosure has a first conductivity type electrode 352, a first conductivity type semiconductor layer 353, and an active layer 354, a second conductivity type semiconductor layer 355, and a second conductivity type electrode 356, like the semiconductor light emitting diode described with reference to FIG. 4. In addition, the semiconductor light emitting diode according to the present disclosure includes a passivation layer 390 formed to cover at least a portion of the semiconductor light emitting diode. A portion of the semiconductor light emitting diode has a region not covered with the passivation layer 390.

Meanwhile, a plurality of semiconductor light emitting diodes 350 are disposed in the groove 161d formed in the barrier rib 161e. Each of the plurality of semiconductor light emitting diodes 350 is disposed in contact with the dielectric layer 161b. In this specification, one surface of the semiconductor light emitting diode 350 in contact with the dielectric layer 161b is defined as a first surface.

A first assembly control layer 410 is formed on a portion of the entire region of the first surface, and a second assembly control layer 420 is formed on another portion of the entire region of the first surface.

The first assembly control layer 410 is made of a material having higher conductivity than the second assembly control layer. For example, the first assembly control layer 410 may be formed of a metal such as Ti, Ni, Au, or Sn, or a transparent electrode such as ITO. For the self-assembly yield, the conductivity of the material constituting the first assembly control layer 410 is preferably $1\times10^6$ S·m$^{-1}$ or more.

Meanwhile, the first assembly control layer 410 is not formed to cover the entire first surface, but is formed to cover a portion of the first surface. In an embodiment, when the first surface has a rectangular shape, the first assembly control layer 410 may be formed in a rectangular shape on one side of the first surface.

Meanwhile, the first assembly control layer 410 is formed in a region of the entire region of the first surface where the first assembly control layer 410 is not formed. However, it is not necessary for the second assembly control layer 420 to be formed in all the region of the entire region of the first surface where the first assembly control layer 410 is not formed.

The second assembly control layer 420 is made of a material having a lower conductivity than the first assembly control layer 410. For example, the first assembly control layer 410 may be made of SiO$_2$. For the self-assembly yield, the conductivity of the material constituting the second assembly control layer 420 is preferably $1\times10^{-1}$ S·m$^{-1}$ or less.

In one embodiment, when the first surface has a rectangular shape, the first assembly control layer 410 is formed in a rectangular shape on one side of the first surface, and the second assembly control layer 420 may be formed in a rectangular shape on the other side of the first surface.

Meanwhile, an area of the first assembly control layer is preferably 0.5 to 5.0 times an area of the second assembly control layer 420.

Meanwhile, the thickness of the first and second assembly control layer is preferably 10 to 1000 nm.

When an electric field is formed between the assembled electrodes during self-assembly, an attractive force is formed between the first assembly control layer 410 and the assembled electrode.

Specifically, the electric force acting on the semiconductor light emitting diode when the AC electric field is formed is as shown in Equation 1 below.

$$\vec{F}_{DEP} = 2\pi\varepsilon_1 Re|\underline{K}(\omega)|r^3 \nabla E_{rms}^2 \qquad \text{[Equation 1]}$$

In Equation 1, the direction of the force is determined according to the sign of the Re|K| value. Re|K| is calculated according to Equation 2 below.

$$Re|\underline{K}| = \frac{\varepsilon_2 - \varepsilon_1}{\varepsilon_2 + 2\varepsilon_1} + \frac{3(\varepsilon_1\sigma_2 - \varepsilon_2\sigma_1)}{\tau_{MW}(\sigma_2 + 2\sigma_1)^2(1 + w^2\tau^2_{MW})} \qquad \text{[Equation 2]}$$

In Equation 1, ε1 is the dielectric constant of the fluid, and ε2 is the dielectric constant of particles affected by the electric field. Also, σ1 is the conductivity of the fluid, and σ2 is the conductivity of the particles affected by the electric field.

Since the semiconductor light emitting diode is made of different materials, the intensity and direction of the electric field applied to each portion of the semiconductor light emitting diode may vary.

Referring to Equation 2, when the conductivity of the particle is small, the Re|K| value becomes negative. In this case, a force pushing toward the weak electric field is generated. In other words, a repulsive force is generated based on the assembled electrode.

On the other hand, when the conductivity of the particle is high, the Re|K| value becomes positive. In this case, a force pulling toward the strong electric field is generated. In other words, the attractive force is generated based on the assembled electrode.

Since the first assembly control layer 410 is made of a material having high conductivity, when an electric field is generated between the assembled electrodes, an electric force acts in a direction toward the assembled electrodes.

Meanwhile, since the second assembly control layer 420 is made of a material having low conductivity, when an electric field is generated between the assembled electrodes, an electric force acts in a direction opposite to the direction toward the assembled electrodes.

For the above reasons, when the electric field is formed at a specific point of the assembly board, the first assembly control layer 410 is disposed preferentially to the specific point. By utilizing this, even when the asymmetric semiconductor light emitting diode is used for self-assembly, it is possible to align the semiconductor light emitting diode in one direction.

Hereinafter, the structure of the assembled electrode for aligning the semiconductor light emitting diode in one direction using the above-described first and second assembly control layers will be described in detail.

Figure 12:
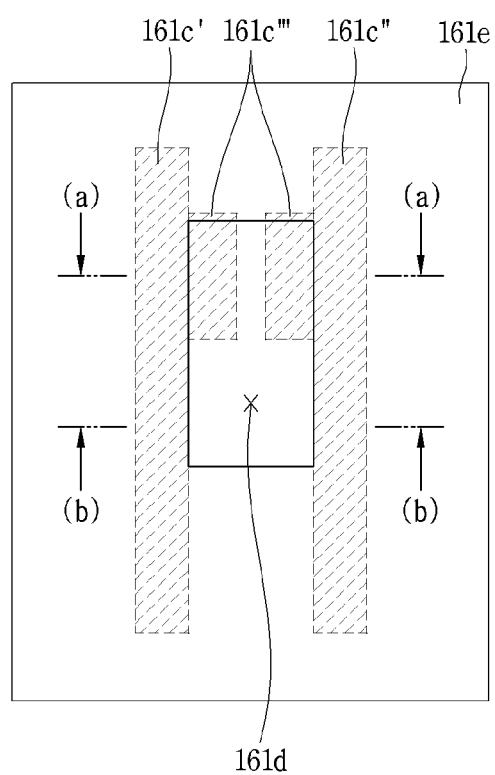
FIG. 12 is a plan view of an assembly board according to the present disclosure.
Figure 13:
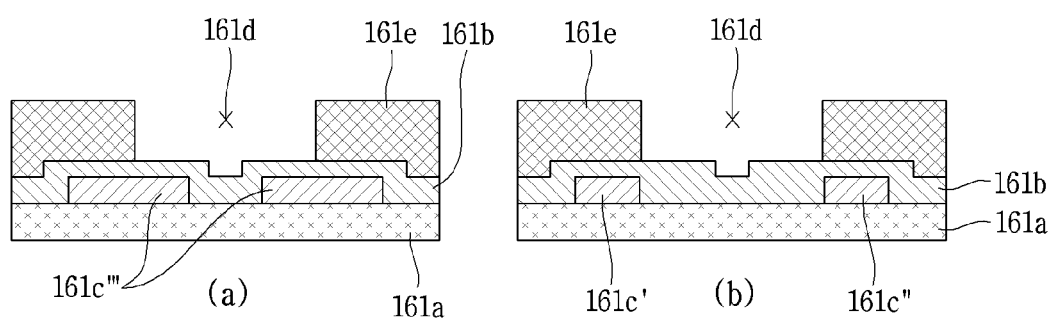
FIG. 13 is a cross-sectional view taken along lines (a)-(a) and (b)-(b) of FIG. 12.

FIG. 12 is a plan view of an assembly board according to the present disclosure, and FIG. 13 is a cross-sectional view taken along lines (a)-(a) and (b)-(b) of FIG. 12.

The assembled electrodes 161c' and 161c" may include protrusions 161c'". Specifically, the assembly board may include the first electrode 161c' and the second electrode 161c" disposed with the semiconductor light emitting diode interposed therebetween. The protrusion 161c'" formed on the first electrode 161c" and the protrusion 161c'" provided on the second electrode 161c" are formed to face each other.

Meanwhile, a portion of the groove 161d formed in the assembled electrode overlaps the protrusion 161c'" and the remaining portion thereof is formed not to overlap the protrusion 161c'". In this case, the protrusion 161c'" is disposed to overlap the groove 161d at one side of the groove 161d. Accordingly, a region that does not overlap the protrusion 161c'" is formed on the other side of the groove 161d.

Hereinafter, a structure in which the semiconductor light emitting diode is seated on the assembly board when self-assembly is performed with the assembly board having the above-described structure will be described.

Figure 14:
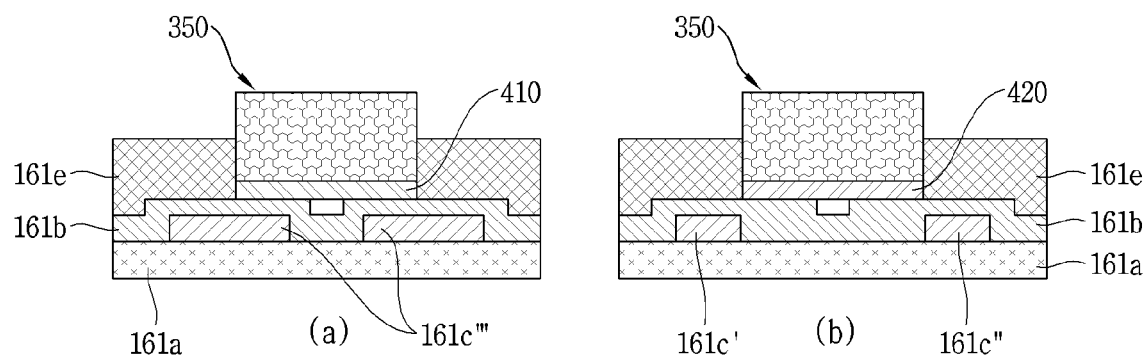
FIG. 14 is a cross-sectional view taken along lines (a)-(a) and (b)-(b) of FIG. 12 after the semiconductor light emitting diode is mounted on the assembly board.
Figure 15:
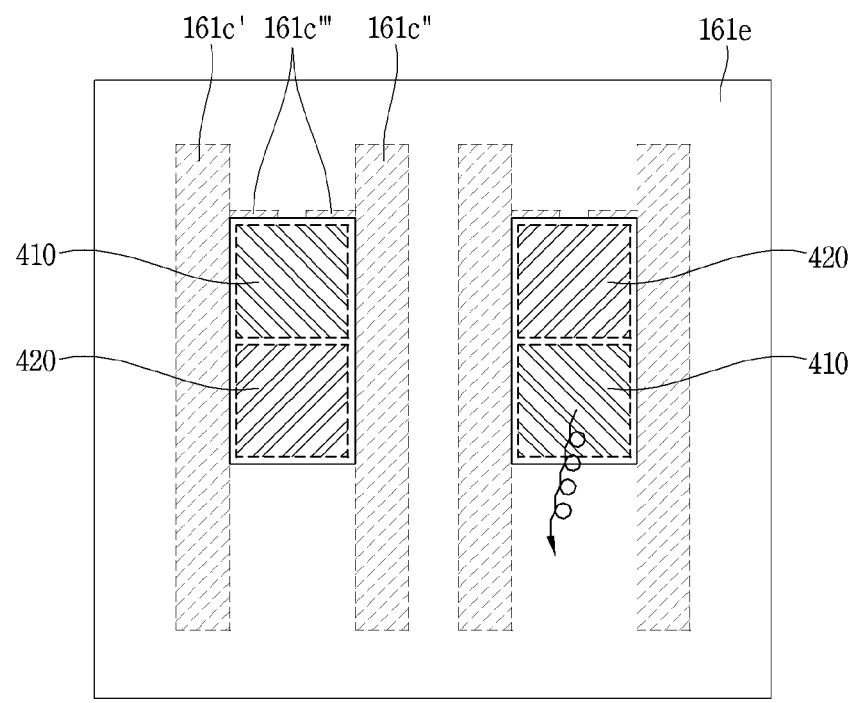
FIG. 15 is a conceptual diagram illustrating a phenomenon that occurs when not seated in a predetermined direction.

FIG. 14 is a cross-sectional view taken along lines (a)-(a) and (b)-(b) of FIG. 12 after the semiconductor light emitting diode is mounted on the assembly substrate, and FIG. 15 is a conceptual diagram illustrating a phenomenon that occurs when not seated in a predetermined direction.

In the above structure, when voltage is applied to the first and second electrodes 161c' and 161c", a region in which an electric field is relatively strong and a region in which an electric field is relatively weak are generated inside the groove 161d. Specifically, a strong electric field is generated in a partial region (hereinafter, referred to as a first region) of the groove 161d which overlaps the protrusion 161c'", and a weak electric field is generated in the other region (hereinafter, referred to as a second region) of the groove which does not overlap the protrusion 161c'".

Here, an area of the first region is preferably 0.5 to 5.0 times an area of the second region. Specifically, the area ratio between the first and second regions is preferably the same as the area ratio between the first and second assembly control layers.

During self-assembly, an electric force directed toward the first region acts on the first assembly control layer 410. Meanwhile, an electric force acts on the second assembly control layer 410 in a direction opposite to that of the first region. Accordingly, referring to FIG. 14, when the semiconductor light emitting diode is seated in the groove, the first assembly control layer 410 is disposed to overlap the protrusion 161c''''. Meanwhile, the second assembly control layer 410 is seated on the dielectric layer 161b that does not overlap the protrusion 161c'".

Meanwhile, referring to FIG. 15, even if the second assembly control layer is disposed to overlap the protrusion 161c'" during self-assembly, since a repulsive force is strongly generated between the protrusion 161c'" and the second assembly control layer 420, the semiconductor light emitting diode 350 is separated from the groove. As a result, the first assembly control layer 410 is disposed to overlap the protrusion 161c'".

Referring back to FIG. 11, the present disclosure includes a structure for preventing the dielectric layer from being assembled in contact with the opposite surface of the first surface. Specifically, a passivation layer 390 may be formed on a side surface of the semiconductor light emitting diode and on a surface opposite to the first surface.

The passivation layer 390 is made of a material having a lower conductivity than that of a material constituting the first assembly control layer 410. In an embodiment, the passivation layer 390 may be made of the same material as the second assembly control layer 410.

Accordingly, when an electric field is formed between the assembled electrodes during self-assembly, an electric force in a direction opposite to that of the assembled electrode is applied to the passivation layer 390. Accordingly, the semiconductor light emitting diode 350 is assembled preferentially in a direction in which the first surface on which the first assembly control layer 410 is formed faces the dielectric layer 161b. In addition, even when randomly assembled such that the opposite surface of the first surface faces the dielectric layer 161b, a repulsive force acts between the passivation layer 390 and the assembled electrode, so that the semiconductor light emitting diode 350 is separated from the groove 161d.

The passivation layer 390 is preferably formed to cover the entire side surface of the semiconductor light emitting diode and a surface opposite to the first surface. Through this, the present disclosure prevents the conductive electrode formed in the semiconductor light emitting diode from being oxidized through contact with the fluid, and can be assembled in a direction in which the first surface on which the first assembly control layer 410 is formed faces the dielectric layer.

However, when the passivation layer 390 is formed to cover all the side surface of the semiconductor light emitting diode and the opposite surface of the first surface, the wiring electrode and the conductive electrode cannot be electrically connected.

In this case, after self-assembly, only a portion of the passivation layer is etched to connect the wiring electrodes. This will be described in detail using the accompanying drawings.

Figure 16:
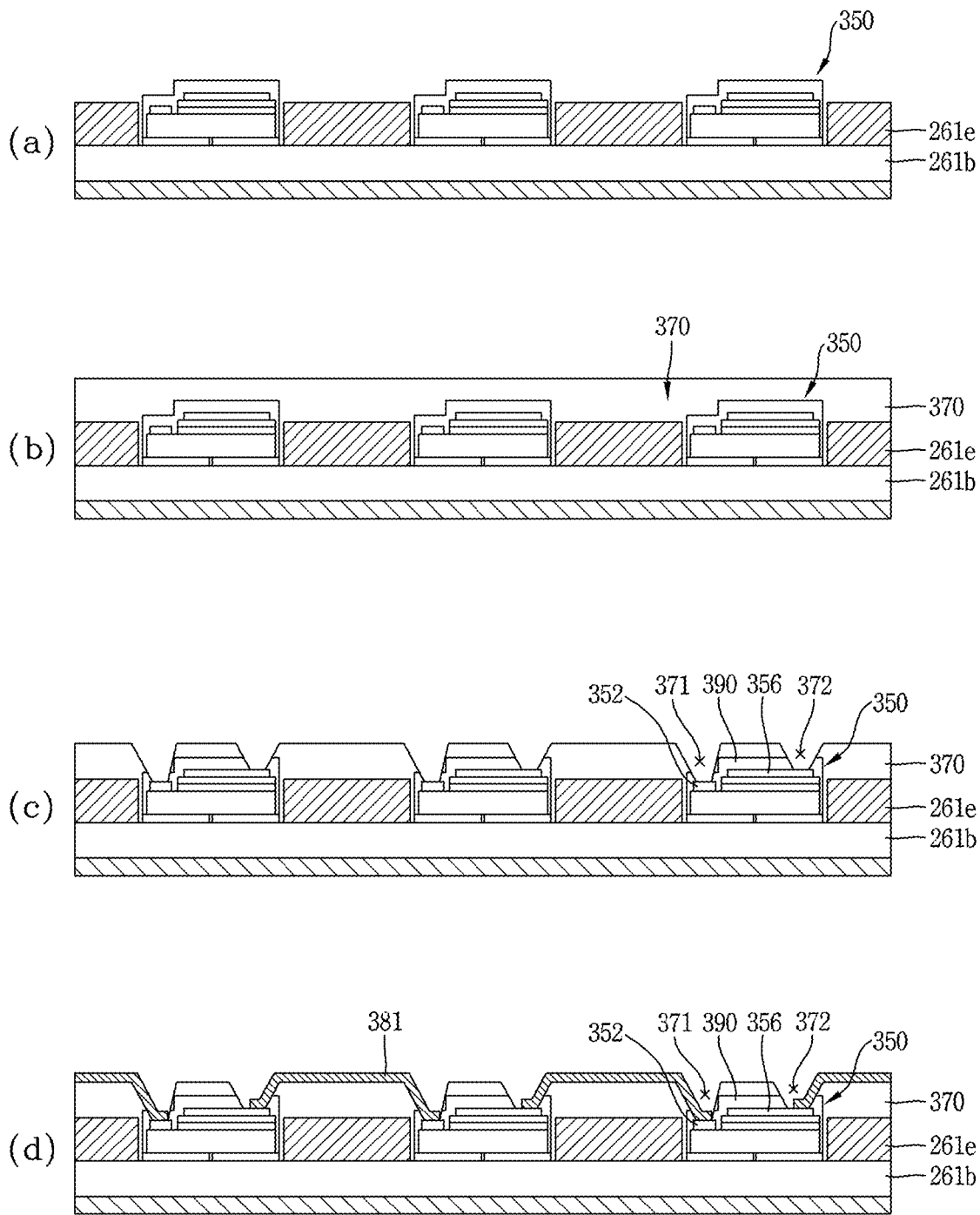
FIG. 16 is a conceptual diagram illustrating a process of manufacturing a display device after a semiconductor light emitting diode is self-assembled to a wiring board using the self-assembly apparatus of FIG. 6.

FIG. 16 is a conceptual diagram illustrating a process of manufacturing a display device after a semiconductor light emitting diode is self-assembled to a wiring board using the self-assembly apparatus of FIG. 6.

Referring to FIG. 16, after assembling the semiconductor light emitting diodes at a predetermined position on an assembly board by inducing movement of the semiconductor light emitting diodes in the fluid chamber by the above-described process, a planarization layer 370 can be filled between the plurality of semiconductor light emitting diodes (FIG. 16(b)). More specifically, as described above, a gap exists between the groove 161d formed in the assembly board and the semiconductor light emitting diode. The planarization layer 370 fills the gap while covering the semiconductor light emitting diode together with the barrier rib.

Through this process, a structure in which the planarization layer 370 surrounds the semiconductor light emitting diode may be formed in the display. In this case, the planarization layer 370 may be made of a polymer material to be integrated with the barrier rib. Although FIG. 16 shows the planarization layer 370 and the barrier rib 261e separately for convenience of explanation, in reality, the planarization layer 370 and the barrier rib 261e may form a single layer. In other words, when the planarization layer 370 is formed, the barrier rib 261e becomes a portion of the planarization layer 370.

In the display device implemented by the process illustrated in FIG. 16, the planarization layer 370 may include a plurality of cells, and the plurality of semiconductor light emitting diodes 350 may be accommodated in the cells. In other words, in the final structure, the cells provided in the self-assembly step are changed into the inner space of the planarization layer 370.

Contact holes 371 and 372 may be formed for wiring (FIG. 16(c)). The contact holes 371 and 372 may be formed in each of the first conductive electrode 352 and the second conductive electrode 356. In this process, a portion of the passivation layer 390 covering the semiconductor light emitting diode is etched.

Finally, the first wiring electrode 381 and the second wiring electrode 382 are connected to the plurality of semiconductor light emitting diodes through the contact hole (FIG. 16(d)).

The first wiring electrode 381 and the second wiring electrode 382 may extend to one surface of the planarization layer 370. In this case, one surface of the planarization layer 370 may be opposite to the surface covering the dielectric layer 261b. For example, the first wiring electrode 381 extends from the first conductive electrode 352 to the upper surface of the planarization layer 370, through a first contact hole 371 formed on the upper side of the first conductive electrode 352. The second wiring electrode 382 extends to the upper surface of the planarization layer 370 through a second contact hole 372 formed on the upper side of the second conductive electrode 356.

According to the above-described manufacturing method, since the passivation layer covering most of the semiconductor light emitting diode is formed from the manufacturing step of the semiconductor light emitting diode, there is no need to form a separate passivation layer after the semiconductor light emitting diode is transferred. In addition, there is no need to perform a process of exposing the conductive electrode of the semiconductor light emitting diode to the outside in the manufacturing step of the semiconductor light emitting diode. Accordingly, the number of processes is reduced, and process errors are reduced.

As described above, according to the present disclosure, even if the semiconductor light emitting diode is asymmetrically formed, it is possible to align the semiconductor light emitting diode in a predetermined direction during self-assembly. Through this, the present disclosure makes it possible to utilize a semiconductor light emitting diode having a structure capable of maximizing light efficiency for self-assembly.

What is claimed is:

1. A display device comprising:
   a base portion;
   a plurality of assembled electrodes disposed on the base portion and configured to generate an electric field when power is applied;
   a dielectric layer formed to cover the plurality of assembled electrodes; and
   a plurality of semiconductor light emitting diodes disposed on the dielectric layer;
   wherein each of the plurality of semiconductor light emitting diodes includes:
   a first assembly control layer formed in a first portion of an entire area of one surface facing the dielectric layer, the first assembly control layer being made of a first material;
   a second assembly control layer formed in a second portion, different from the first portion, of the entire area of the one surface facing the dielectric layer, the second assembly control layer being made of a second material different from the first material; and
   a passivation layer formed during manufacture on a surface opposite to the one surface,
   wherein the second assembly control layer is configured so that an electric force acts in a direction opposite to a direction toward the plurality of assembled electrodes when an electric field is generated between the plurality of assembled electrodes.

2. The display device of claim 1, wherein a conductivity of the first material is greater than a conductivity of the second material.

3. The display device of claim 2,
   wherein the first assembly control layer is formed on a first side of a respective one of the plurality of semiconductor light emitting diodes, and
   wherein the second assembly control layer is formed on a second side, different from the first side, of the respective one of the semiconductor plurality of light emitting diodes.

4. The display device of claim 3, wherein each of the plurality of assembled electrodes includes a corresponding protrusion protruding in a first direction intersecting a second direction in which the plurality of assembled electrodes extend.

5. The display device of claim 4, wherein each of the plurality of assembled electrodes includes a first electrode and a second electrode disposed with the semiconductor light emitting diodes therebetween.

6. The display device of claim 5, wherein, for the corresponding protrusion formed for each of the plurality of assembled electrodes, a first protrusion corresponding to the first electrode and a second protrusion corresponding to the second electrode are formed to face each other.

7. The display device of claim 6, wherein the first assembly control layer is disposed to overlap the first and second protrusions.

8. The display device of claim 6, wherein the second assembly control layer is disposed to overlap a portion of the base portion in which the first and second protrusions are not formed.

9. The display device of claim 1, wherein an area of the first assembly control layer is 0.5 to 5.0 times an area of the second assembly control layer.

10. The display device of claim 2,
    wherein the conductivity of the first material is $1\times10^{+6}$ $S \cdot m^{-1}$ (Siemens per meter) or more, and
    wherein the conductivity of the second material is $1\times10^{-1}$ $S \cdot m^{-1}$ or less.

* * * * *